United States Patent [19]

Saeva

[11] Patent Number: 5,089,374

[45] Date of Patent: Feb. 18, 1992

[54] NOVEL BIS-ONIUM SALTS AND THE USE THEREOF AS PHOTOINITIATORS

[75] Inventor: Franklin D. Saeva, Webster, N.Y.

[73] Assignee: Eastman Kodak Company, Rochester, N.Y.

[21] Appl. No.: 611,631

[22] Filed: Nov. 13, 1990

Related U.S. Application Data

[63] Continuation-in-part of Ser. No. 570,448, Aug. 20, 1990, abandoned.

[51] Int. Cl.$^5$ .................. G03C 1/795; G03F 7/029
[52] U.S. Cl. .................... 430/271; 430/280; 430/914; 522/31; 526/89; 526/193; 526/194; 526/217; 526/222
[58] Field of Search .................. 522/31; 430/914, 280, 430/281, 271; 526/194, 193, 217, 222, 89

[56] References Cited

U.S. PATENT DOCUMENTS

| | | | |
|---|---|---|---|
| 4,058,401 | 11/1977 | Crivello | 930/280 |
| 4,250,203 | 2/1981 | Schlesinger et al. | 522/31 |
| 4,624,912 | 11/1986 | Zweifel et al. | 430/258 |
| 4,760,013 | 7/1988 | Hacker et al. | 522/31 |
| 4,933,377 | 1/1990 | Saeva et al. | 430/280 |
| 4,954,416 | 9/1990 | Wright et al. | 522/31 |

FOREIGN PATENT DOCUMENTS

| | | | |
|---|---|---|---|
| 0279210 | 8/1988 | European Pat. Off. | |
| 330117 | 8/1989 | European Pat. Off. | 522/31 |
| 0331413 | 9/1989 | European Pat. Off. | |

Primary Examiner—Marion E. McCamish
Assistant Examiner—C. RoDee
Attorney, Agent, or Firm—Ogden H. Webster

[57] ABSTRACT

Bis-sulfonium, -selenonium, -arsonium, -ammonium, and -phosphonium salts useful as photoinitiators, comprise:

an aromatic or heterocyclic aromatic group which absorbs UV or visible radiation and which exhibits a higher energy occupied molecular orbital than at least one other substituent attached to each of the S, Se, As, N or P atoms of said salt;

at least one substituent, attached to each of the S, Se, As, N or P atoms of said salt, which comprises an electron-withdrawing group which causes the lowest unoccupied molecular orbital to be localized on the substituent and the S, Se, As, N or P atom of the salt;

an insulating group which links said aromatic or heterocyclic aromatic group to each of the S, Se, As, N, or P atoms of said salt, said insulating group essentially preventing $\pi$ resonance between said aromatic or heterocyclic aromatic group and the other substituents in said salt; and two anions;

said salt being capable, upon exposure to UV or visible radiation absorbed by said aromatic or heterocyclic aromatic group, of forming a Bronsted acid.

The invention also relates to the use of such photoinitiators.

5 Claims, No Drawings

NOVEL BIS-ONIUM SALTS AND THE USE THEREOF AS PHOTOINITIATORS

This invention relates to certain novel bis-onium salts and to the use of such salts as photoinitiators.

Saeva and Breslin U.S. Patent application Ser. No. 419,245, filed Oct. 10, 1989, describes certain sulfonium, selenium, arsonium, ammonium and phosphonium salts, useful as photoinitiators, which feature (1) a chromophore which absorbs visible radiation and which exhibits a higher energy molecular orbital than at least one other substituent attached to the S, Se, As, N or P atom of the salt; (2) an insulating group which essentially prevents $\pi$ resonance between the chromophore and the other substituents in the salt; and (3) at least one substituent, attached to the S, Se, As, N or P atom, which comprises an electron withdrawing group and which exhibits a lower energy lowest unoccupied molecular orbital than the chromophore. Such salts, upon exposure to visible radiation, are capable of forming a Bronsted acid. The Bronsted acid thus formed can cure a wide variety of materials. See, for example, *UV Curing: Science and Technology*, edited by S. Peter Pappas and published (1978) by Technology, Marketing Corporation, 64 Westover Road, Stamford, Conn. 06902.

While the onium salts described by Saeva and Breslin are highly useful, it is desirable to provide onium salts which are even more efficient, and which exhibit good thermal stability and solubility in common solvents.

The onium salts of this invention are bis-sulfonium, -selenonium, -arsonium, -ammonium, and -phosphonium salts which comprise:
an aromatic or heterocyclic aromatic group which absorbs UV or visible radiation and which exhibits a higher energy occupied molecular orbital than at least one other substituent attached to each of the S, Se, As, N or P atoms of said salt;
at least one substituent, attached to each of the S, Se, As, N or P atoms of said salt, which comprises an electron-withdrawing group which causes the lowest unoccupied molecular orbital to be localized on the substituent and the S, Se, As, N or P atom of the salt;
an insulating group which links said aromatic or heterocyclic aromatic group to each of the S, Se, As, N, or P atoms of said salt, said insulating group essentially preventing $\pi$ resonance between said aromatic or heterocyclic aromatic group and the other substituents in said salt; and
two anions;
said salt being capable, upon exposure to UV or visible radiation absorbed by said aromatic or heterocyclic aromatic group, of forming a Bronsted acid. The bis-onium salts of this invention are highly efficient, thermally stable and soluble in common solvents.

The bis-onium salts of this invention comprise an aromatic or heterocyclic aromatic group which absorbs UV or visible radiation. The aromatic or heterocyclic aromatic group is chemically linked to the two onium salt atoms by an insulating group which essentially prevents $\pi$ resonance between the aromatic or heterocyclic aromatic group and the rest of the salt. As used herein, "essentially insulating" means that the bis-onium salt exhibits a shift in absorbance of no more than about 30 nm, and preferably less than 15 nm, as compared to the electronic absorption of the aromatic or heterocyclic aromatic group. Bis-onium salts which do not have an insulating linking group do not have sufficient thermal stability for practical applications.

Preferably, the aromatic or heterocyclic aromatic group is non-basic and the conjugate acid has a pKa from 0 to $-20$. Advantageously, the aromatic or heterocyclic aromatic group has a hydroxy, nitrile, carbonyl or carboxy group, or an ether or ester group which in its protonated form would be a strong acid as previously defined.

The preferred bis-onium salts of this invention are sulfonium salts. Bis-arsonium and -selenonium salts are also highly useful. Many bis-sulfonium, -selenonium and -arsonium salts can be used without a separate proton source material. Proton source materials, such as water, an amine or an alcohol, are employed when the bis-onium salt is an ammonium or phosphonium salt. When the bis-ammonium and -phosphonium salts of this invention are exposed to visible radiation in the presence of a proton source, an intermolecular reaction occurs which results in the formation of a Bronsted acid comprising the anion of the salt and the proton from the proton source material.

The bis-sulfonium, -selenonium and -arsonium salts of this invention preferably comprise an aromatic or heterocyclic aromatic group which has a releasable, positive hydrogen ion. Upon exposure to visible radiation, an intramolecular rearrangement occurs which results in the formation of a Bronsted acid comprising the anion of the salt and the removable positive hydrogen ion. However, bis-sulfonium, -selenonium and -arsonium salts can comprise an aromatic or heterocyclic aromatic group which does not contain a removable, positive hydrogen ion. Such salts are advantageously used in combination with a proton source material and form, upon exposure to visible radiation, a Bronsted acid comprising the anion of the salt and the proton from the proton source material. The Bronsted acid is formed by an intermolecular reaction between the salt and the proton source material by a mechanism which involves a photoinduced electron transfer to provide an in-cage cation-radical/radical pair, and a second electron transfer from the radical to the cation-radical.

The bis-onium salts of the present invention can be activated twice by absorbed photons, thereby producing two equivalents of Bronsted acid for each molecule of starting material. The efficiency of the subject bis-onium salts is much higher (sometimes almost 200% higher) than the efficiency of the corresponding mono-onium salts disclosed previously.

Surprisingly, the subject bis-onium salts are soluble in common solvents and do not crystallize readily.

Both symmetrical and unsymmetrical bis-onium salts are useful in accordance with this invention.

A particularly preferred class of onium salts is represented by the following formulas:

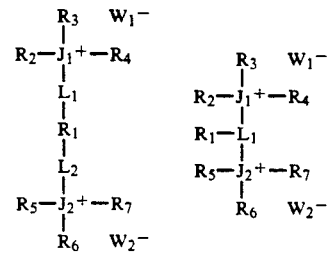

wherein:

R$_1$ represents an electron donating aromatic or heterocyclic aromatic group which absorbs UV or visible radiation and which exhibits a higher energy occupied molecular orbital greater than R$_3$ and R$_6$;

R$_2$ and R$_5$ each, independently, represent the same substituent as R$_3$ or R$_6$ or an alkyl group having from 1 to 18 carbon atoms;

L$_1$ and L$_2$ each, independently, represent a linking group which essentially prevents $\pi$ resonance between R$_1$ and the remainder of the compound;

R$_3$ and R$_6$ each, independently, represent an electron withdrawing alkyl, aryl or heterocyclic group, which electron withdrawing group causes the lowest unoccupied molecular orbital to be localized on R$_3$, R$_6$ and the S, Se, As, N or P atom of the salt;

J$_1$ and J$_2$ each, independently, represent an S, Se, As, N or P atom, and, when J$_1$ or J$_2$ represents As, N or P, R$_4$ and R$_7$, respectively, represent the same substituent as R$_3$, R$_4$, R$_5$ or R$_6$ and, when J$_1$ or J$_2$ represents an S or Se atom, R$_4$ and R$_7$ each, independently, represent 0 or an electron pair; and, W$_1^-$ and W$_2^-$ each, independently, represent an anion capable of forming a Bronsted acid having a pKa of less than 7, said compound being capable, upon exposure to UV or visible radiation absorbed by R$_1$, of forming a Bronsted acid.

In the above formula:

R$_1$ can, for example, represent an electron donating aromatic group having from 6 to 22 carbon atoms, such as an optionally substituted phenylene, naphthylene or anthrylene group; a coumarin group, preferably a hydroxy, methoxy, or carboxy substituted coumarin group; or a bifluorenylidene group; a heterocyclic aromatic group containing from 6 to 20 atoms, and having from 1 to 4 hetero atoms, such as N, e.g., a 1-phenazine group; preferably, the aromatic or heterocyclic aromatic group contains an electron donating substituent, such as alkyl, e.g., methyl, ethyl, propyl or butyl; an amide; or a sulfonamide;

R$_2$ and R$_5$ each, independently, can represent the same substituent as R$_3$ or R$_4$ or an alkyl group having from 1 to 18 carbon atoms, such as methyl, ethyl, propyl, butyl, hexyl, dodecyl, etc.;

L$_1$ and L$_2$ each, independently, can represent a linking group such as an optionally substituted alkylene linkage, advantageously containing from 1 to 18 carbon atoms, such as methylene, ethylene, propylene, butylene etc.; an ester linkage; an amide linkage, an arylene linkage such as a phenylene linkage; an arylakyl linkage in which the alkyl moiety contains from 1 to 6 carbon atoms, e.g., phenethyl; a sulfonate ester linkage, or, a sulfonamide linkage;

R$_3$ and R$_6$ each, independently, can represent an electron withdrawing alkyl, aryl or heterocyclic group, such as optionally substituted alkyl groups having from 1 to 18, and most preferably 1 to 4 carbon atoms; optionally substituted aryl groups have from 6 to 10 carbon atoms, and most preferably a phenyl group; and optionally substituent heterocyclic groups having from 1 to 4 rings and containing from 1 to 3 hetero atoms, such as N, S, 0, Se or Te; preferably the R4 and R7 group contains an electron withdrawing group, such as halogen, preferably F, Cl or Br; CN, NO2, -SO2-, CF3, and the like;

J$_1$ and J$_2$ each, independently, represent an S, Se, As, N or P atom;

when J$_1$ and J$_2$ represent As, N or P, R$_4$ and R$_7$, respectively, represent the same substituent as R$_3$, R$_4$, R$_5$ or R$_6$; and, when J$_1$ or J$_2$ represents an S or Se atom, R$_4$ and R$_7$ each, independently, represent either O or an electron pair; and, W$_1^-$ and W$_2^-$ each, independently, represent an anion capable of forming a Bronsted acid preferably having a pKa of less than 7, such as BF$_4^-$, ClO$_4^-$, AsF$_6^-$, PF$_6^-$, CH$_3$SO$_3^-$, CF$_3$SO$_3^-$, FeCl$_4^-$, BiCL$_4^{-2}$, SnCl$_6^{-3}$, AlF$_6^{-3}$, GaCl$^{4+}$, TiF$_6^-$, ZrF$_6^-$, SbF$_6^-$, or p-toluenesulfonate.

In the most preferred compounds of the invention, in the above formula L$_1$ and L$_2$ each represents a phenyl or naphthyl linkage and J$_1$ and J$_2$ are attached in the 3-position with respect to R$_1$. Such compounds exhibit an unexpected increase in efficency as compared to corresponding isomers limited in the 2- or 4- positions.

Some typical, useful bis-onium salts of this invention are:

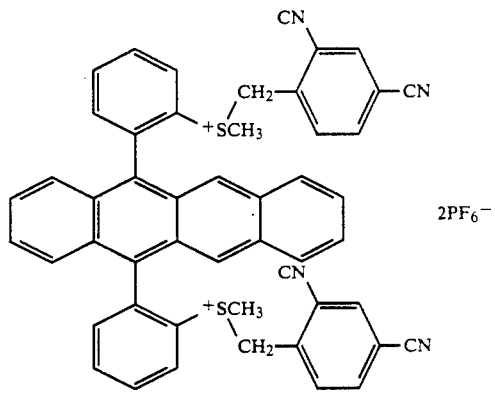

(1) 5,12-[Bis-2-phenylmethyl-2,4-dicyanobenzylsolfonium-bis-hexafluorophosphate]naphthacene

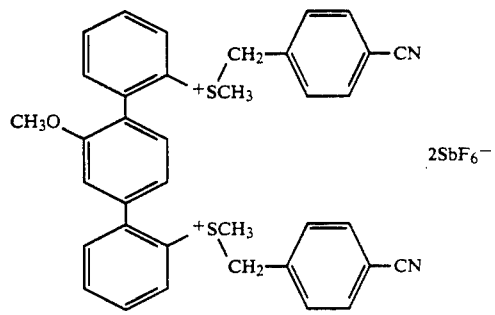

(2) 2,5-[Bis-2-phenylmethyl-p-cyanobenzylsulfonium-bis-hexafluoroantimonate]anisole

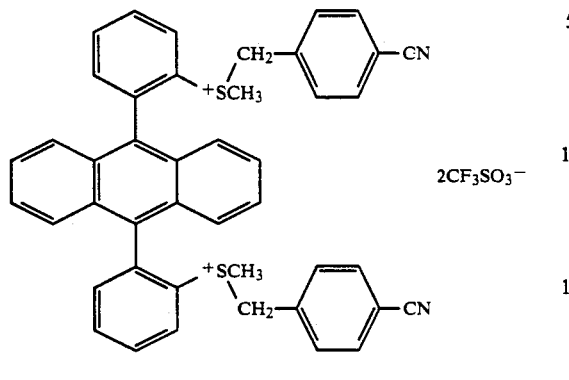

(3) 9,10-[Bis-2-phenylmethyl-p-cyanobenzylsulfonium-bis-trifluoromethanesulfonate]anthracene

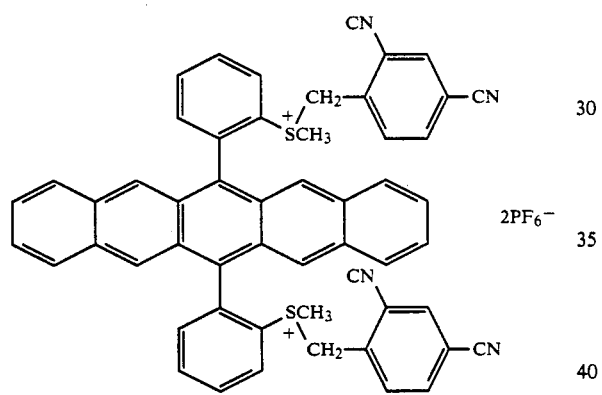

(4) 6,13-[Bis-2-phenylmethyl-2,4-dicyanobenzylsulfonium-bis-hexafluorophosphate]pentacene

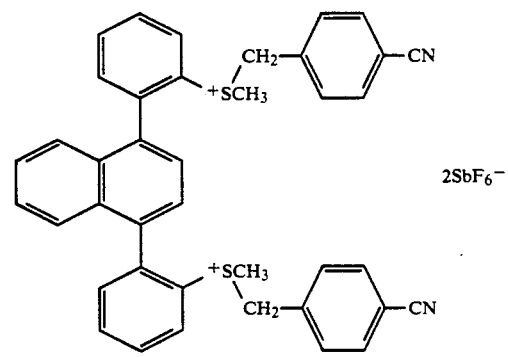

(5) 1,4-[Bis-2-phenylmethyl-p-cyanobenzyl-bis-hexafluoroantimonate]naphthalene

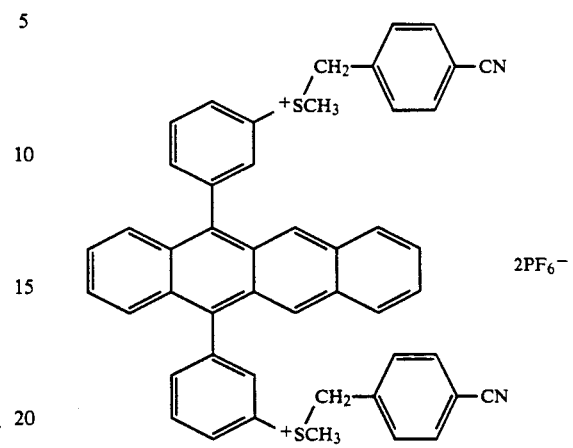

(6) 5,12-(Bis-3-phenylmethyl-4-cyanobenzylsulfonium-bis-hexafluorophosphate)naphthacene

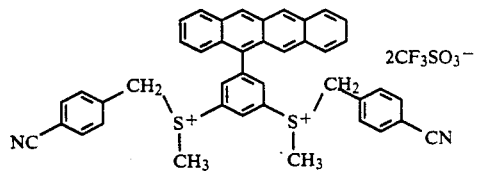

(7) 1-[5-Naphthacenyl]3,5-bis-methyl-p-cyanobenzylphenylsulfonium trifluoromethanesulfonate

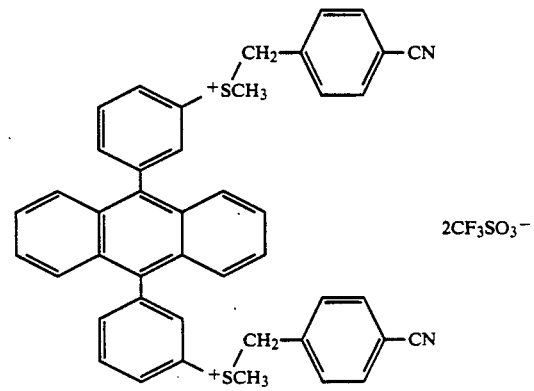

(8) 9,10-(Bis-3-phenylmethyl-p-cyanobenzylsulfonium-bis-trifluoromethanesulfonate)anthracene

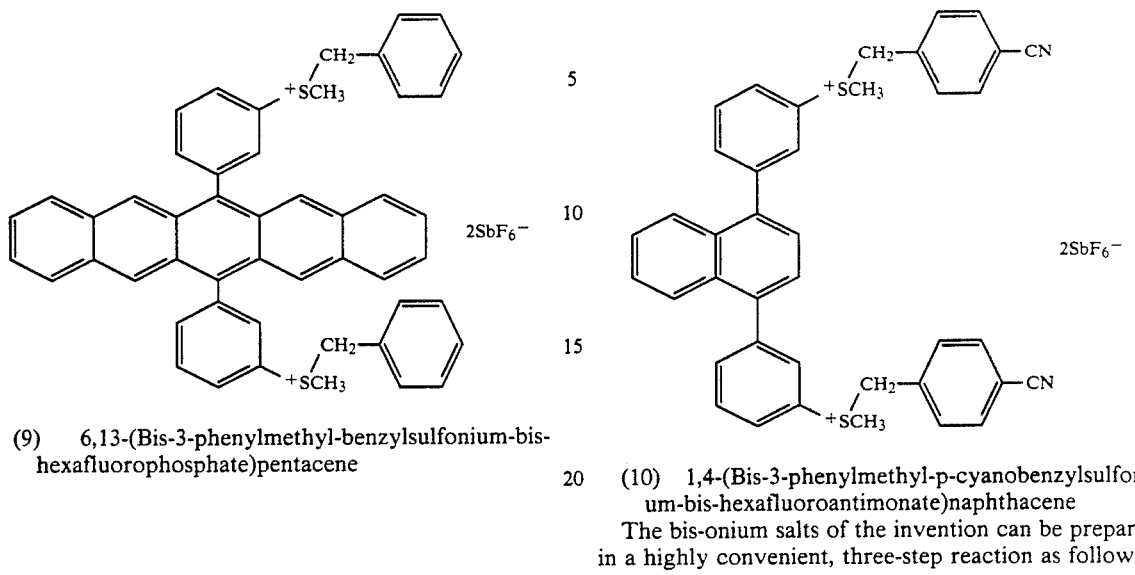
(9) 6,13-(Bis-3-phenylmethyl-benzylsulfonium-bis-hexafluorophosphate)pentacene
(10) 1,4-(Bis-3-phenylmethyl-p-cyanobenzylsulfonium-bis-hexafluoroantimonate)naphthacene
The bis-onium salts of the invention can be prepared in a highly convenient, three-step reaction as follows:
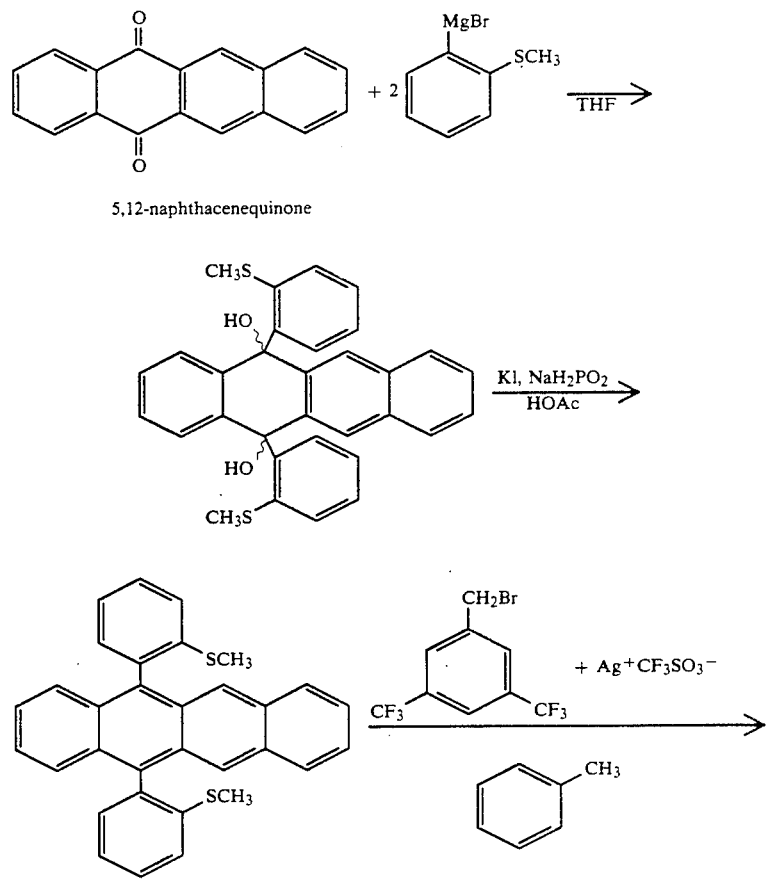
5,12-naphthacenequinone

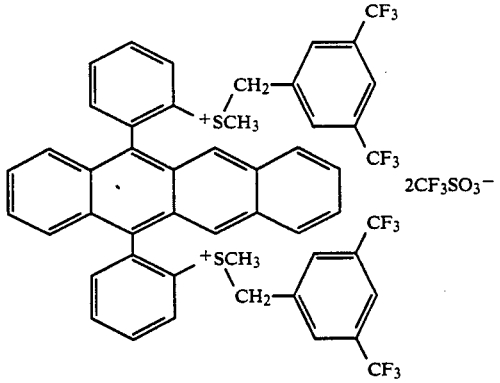

2CF$_3$SO$_3^-$

(11) 5,12-[Bis-2-phenylmethyl-3,5-bis-trifluoromethyl-benzylsulfonium-bis-trifluoromethanesulfonate]-naphthacene

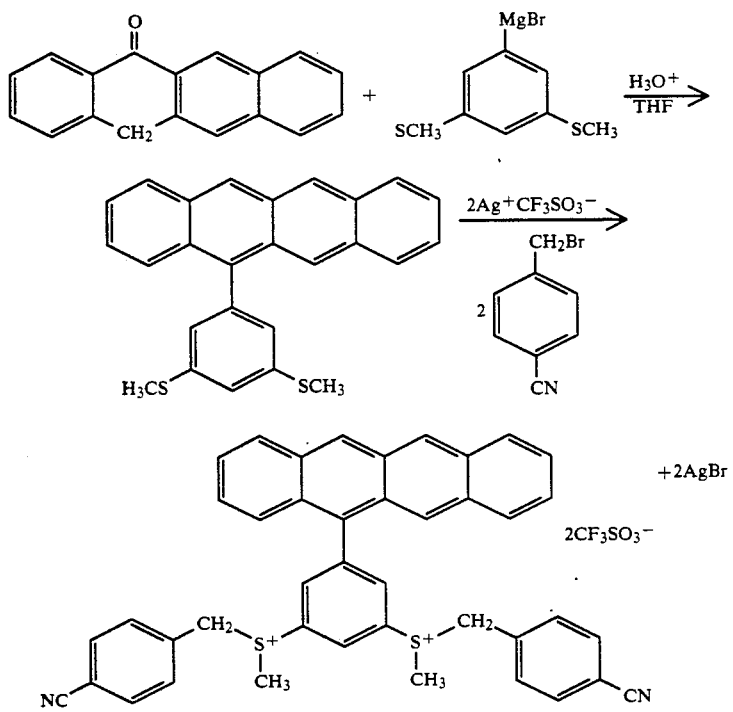

Component (7), i.e., 1-[5-Naphthacenyl]3,5-[bis-[methyl-p-cyanobenzylphenylsulfonium trifluoromethanesulfonate] was prepared as follows:

5-Naphthacenone (0.1 mole) was added to a solution of bis-3,5-thiomethylphenyl magnesium bromide (0.1 mole) in anhydrous tetrahydrofuran (100 ml) at −75° C. The reaction mixture was stirred at −75° C. for 30 minutes and heated at reflux for 15 minutes before the addition of 50 ml of 10% aqueous HCl. The mixture was refluxed for 15 minutes to bring about dehydration. The cooled reaction mixture was extracted with two 100 ml portions of methylene chloride. The combined methylene chloride extract was washed with 5% aqueous HCl and the organic layer dried over MgSO$_4$, filtered and flash evaporated. The crude dithiomethyl compound was recrystallized from nitromethane and vacuum dried before being carried on to the bis-sulfonium salt.

The bis-thiomethylphenyl compound (0.05 mole) was dissolved in 100 ml of toluene along with p-cyanobenzylbromide (0.1 mole). To this solution wrapped in aluminum foil was added Ag$^+$CF$_3$SO$_3^-$ (0.1 mole) as a solid. The reaction mixture was allowed to stir at room temperature for 15 hours before flash evaporating off the toluene in the absence of light. The crude product was dissolved in acetonitrile (50 ml) and filtered to remove AgBr. The volume of the acetonitrile was reduced to about 5 ml and this solution added dropwise to 400 ml of anhydrous ether in the absence of light. The bis-sulfonium salt (I) precipitated from solution as a yellow-brown solid.

Still ather useful onium salts in accordance with this invention are listed below:
    5,12-[Bis-2-phenylmethyl-3,5-bis-trifluoromethylbenzylsulfonium-bis-trifluoromethanesulfonate]-naphthacene;
    9,10-[Bis-3-phenyl-n-butyl-p-cyanobenzylsulfonium trifluoromethanesulfonate]-2-t-butylanthracene;
    1,4-[Bis-3-phenylmethyl-p-cyanobenzyl-bis-hexafluoroantimonate]naphthalene;

5,12-[Bis-3-phenylmethyl-3,5-bis-trifluoromethylbenzylsulfonium-bis-trifluoromethanesulfonate]-naphthacene; and 5,12-[Bis-2-phenethylmethyl-p-cyanobenzylsulfonium-bis-trifluoromethanesulfonate]naphthacene.

The bis-sulfonium salts containing the 3-substituted phenyl linkage can be synthesized in a manner identical to that of the 2-isomer. In this case 3-thiomethylphenylmagnesium bromide is used in place of 2-thiomethylphenylmagnesium bromide in the reaction with 5,12-naphthacenequinone.

The bis-onium salts of this invention can be used in any application where it is desirable to release a Bronsted acid. The subject salts are especially useful in compositions which are curable by a Bronsted acid. Such compositions, also called cationically curable compounds, include cyclic formals and acetals, vinyl ethers, cyclic ethers, lactones, polysiloxanes, ureaformaldehyde resins, melamineformaldehyde resins, and epoxides. A more comprehensive list is detailed in *Cationic Polymerization of Olefins: A critical Inventory* J. P. Kennedy, Wiley Interscience Pub. 1975. Epoxy resins are particularly preferred.

The useful epoxy resins preferably contain a plurality of epoxy groups and may be based on the reaction product of Bisphenol A (i.e. 2,2-bis(4-hydroxyphenyl)propane) and epichlorohydrin, e.g. the resins sold under the registered Trademark Araldite by Ciba-Geigy Ltd., or are the reaction product of epichlorohydrin with a phenol-formaldehyde resin of relatively low molecular weight, e.g. epoxy-Novolaks (available, for example from Dow), or other modified epoxy resins as disclosed in *UV Curing: Science and Technology* (cited above). Still other useful epoxy resins and ether-containing materials polymerizable to a higher molecular weight are listed in Berggren et al U.S. Pat. No. 4,291,114 (1981) col. 4 line 37 through col. 6 line 23 and the silicone curable compositions disclosed by Eckberg U.S. Pat. No. 4,547,431 (1985) col. 3 line 29 through col. 4 line 17.

The bis-onium salts of the invention can comprise from 0.1 to 30, and preferably from 1 to 25 percent by weight of the curable composition.

The bis-onium salts of the invention can be used to provide protective coatings by imagewise or non-imagewise polymerization of monomers, e.g., the epoxide or ether containing monomers referred to above. The present onium salts can be used advantageously to provide overcoats for optical recording elements, such as those described by Thomas et al U.S. Pat. No. 4,380,769 issued Apr. 19, 1983. Such recording elements have on a support, in order, a smoothing layer, a reflection layer, a heat-deformable optical recording layer and a protective overcoat layer.

The bis-onium salts of this invention are useful in making printing plates. For example, the onium salts of this invention and a material which can be chemically modified by a Bronsted acid can be solvent coated as a film onto an aluminum substrate. After the film has dried, it can be exposed to light absorbed by the salt, thus releasing a Bronsted acid. The film can be developed to produce a relief image by heating to vaporize chemical fragments from the exposed areas. The relief image can be inked and the resulting plate can be used as a printing plate. The relief image should be capable of being inked and capable of transferring the ink to a substrate, such as paper.

The bis-onium salts of the invention can also be used in photoelectrographic elements which have a conductive layer in contact with an acid generating layer which contains an onium salt of the invention (the acid generating layer being free of photopolymerizable monomer), as described in Molaire et al U.S. Pat. No. 4,661,429 issued Apr. 28, 1987. Such elements can be imagewise exposed, the acid photogenerating layer can be electrostatically charged, and the resultant electrostatic image can be developed with charged toning particles. Also, the bis-onium salts of the invention can be used in the electrophotographic elements and process described in Scozzofava et al U.S. Pat. 4,485,161 issued Nov. 27, 1984.

The bis-onium salts of the invention can be coated, in a polymer matrix such as polyvinylbenzoate, on a substrate such as aluminum. The coating can be imagewise exposed to produce a Bronsted acid in the irradiated areas. The coating becomes conductive in areas where the Bronsted acid is formed. The surface of the layer can be charged with a corona. In image areas (i.e., light struck areas) the charge is dissipated. The remaining areas remain charged and can be toned with an electrophotographic toner. Additional images can be prepared by repeatedly corona charging and toning the coating.

The bis-onium salts of the invention can also be used in the method of making color filter arrays which is described by Molaire et al U.S. Patent application Ser. No. 871,748 filed June 9, 1986 now U.S. Pat. No. 4,650,734, issued Mar. 17, 1987. In that method, an electrophotographic element having a conductive layer in electrical contact with an acid photogenerating layer comprising an electrically insulating binder and being free of photopolymerizable materials, is imagewise exposed and electrostatically charged to form a latent image, and the latent image is developed with colored toner particles to form a single color array. Those steps can be repeated, with different colored toners to produce a multicolored filter array.

The bis-onium salts of this invention are particularly useful as photoinitiators to produce imagewise release of chemical fragments in a polymer system for photoresist or printing plate applications.

In one highly convenient aspect of this invention, the bis-onium salts described herein together with a material which is curable by a Bronsted acid are coated on a suitable support, such as a polyester support. The resulting product is useful for various applications, such as the preparation of printing plates or printed circuit boards, by laminating to a suitable metal substrate, such as an aluminum or copper substrate, the polyester film having coated thereon the bis-onium salts of the invention and a material sensitive to a Bronsted acid.

The following examples are included for a further understanding of the invention.

The following examples show the use of the salts of the invention to produce the imagewise release of chemical fragments in a polymer system for photoresist applications.

EXAMPLE 1

Imagewise Release of a Chemical Fragment 5,12-[Bis-2-phenylmethyl-3,5-bis-trifluoromethylbenzylsulfonium-bis-trifluoromethanesulfonate]naphthacene (10% by weight) was dissolved in sufficient acetone solvent along with polyvinyl (4-t-butylphenylcarbonate) as host polymer (90% by weight) to make a homogeneous solution. A film of the polymer-photoacid composition was cast onto a silicon wafer. The film was then irradiated in an imagewise fashion with an argon ion laser emitting at 488/514 nm. In the irradiated areas a Bronsted acid was produced which catalyzed the thermal transformation of the original polymer to polyvinylphenol after heating at 100° C. for 5-15 minutes. The regions containing the polyvinylphenol were then selectively removed with an aqueous base solution (10-50% hydroxide or carbonate solution).

EXAMPLE 2

Imagewise Release of a Silane Chemical Fragment 5,12-[Bis-2-phenylmethyl-2,4-dicyanobenzylsulfonium-bis-hexafluorophosphate]naphthacene (10% by weight) was dissolved in sufficient dichloromethane along with a polyvinyl benzyl polymer containing pendant allyl-t-butyldimethyl silyl groups (90% by weight) to make a homogeneous solution. A film of the polymer-photoacid composition was cast onto a silicon wafer. The film was then irradiated in an imagewise fashion using an argon ion laser emitting at 488/514 nm. In the irradiated area a Bronsted acid was produced which catalyzed the thermal transformation to the vinyl polymer without the pendant silane functionality. Exposure of the irradiated and heated film to an oxygen plasma selectively removed the irradiated areas by a completely dry process.

EXAMPLE 3

Imagewise Release of a Chemical Fragment 6,13[Bis-2-phenylmethyl-benzylsulfonium-bis-hexafluorophosphate]pentacene (10% by weight) was dissolved in sufficient acetonitrile solvent along with polyvinyl (4-t-butylphenylcarbonate) as host polymer (90% by weight) to make a homogeneous solution. A film of the polymer photoacid composition was cast onto a silicon wafer. The film was then irradiated in an imagewise fashion with an argon ion laser emitting at 488/514 nm. In the irradiated areas a Bronsted acid was produced which catalyzed the thermal transformation of the original polymer to polyvinylphenol after heating at 100° C. for 5-15 minutes. The regions containing the polyvinylphenol were then selectively removed with an aqueous base solution (10-50% hydroxide or carbonate solution).

EXAMPLE 4

Imagewise Release of a Silane Chemical Fragment 9,10-[Bis-2-phenylmethyl-p-cyanobenzylsulfonium-bis-trifluoromethanesulfonate]anthracene (10% by weight) with a polyvinyl benzyl polymer containing pendant allyl-t-butyldimethyl silyl groups (90 % by weight) to make a homogeneous solution. A film of the polymer photoacid composition was cast onto a silicon wafer. The film was then irradiated in an imagewise fashion using a mercury-xenon lamp. In the irradiated area a Bronsted acid was produced which catalyzed the thermal transformation to the vinyl polymer without the pendant silane functionality. Exposure of the irradiated and heated film to an oxygen plasma selectively removed the irradiated areas by a completely dry process.

EXAMPLE 5

Imagewise Release of a Silane Chemical Fragment 9,10-Bis[3-phenyl-n-butyl-p-cyanobenzylsulfonium hexafluoroantimonate]2-t-butylanthracene (10% by weight) with a polyvinyl benzyl polymer containing pendant allyl-t-butyldimethyl silyl groups (90 % by weight) to make a homogeneous solution. A film of the polymer photoacid composition was cast onto a silicon wafer. The film was then irradiated in an imagewise fashion using a mercury-xenon lamp. In the irradiated area a Bronsted acid was produced which catalyzed the thermal transformation to the vinyl polymer without the pendant silane functionality. Exposure of the irradiated and heated film to an oxygen plasma selectively removed the irradiated areas by a completely dry process.

Results similar to those described in the above examples can be obtained with other sulfonium and arsonium salts of the type described above. Also, by employing a protonating material such as water or an alcohol, similar results can be obtained with the phosphonium and ammonium salts described above, and with the sulfonium, selenonium and arsonium salts described above but in which the chromophore does not contain a removable, positive hydrogen ion.

The following examples illustrate polymer coatings by photoinduced cationic polymerization of epoxide monomers and prepolymers.

EXAMPLE 6

9,10-[Bis-2-phenylmethyl-p-cyanobenzylsulfonium-bis-hexafluoroantimonate]anthracene (0.1 g) was dissolved in methylene chloride (10 ml) along with cyclohexene oxide (1.0 g) and the mixture coated onto a glass substrate and irradiated with visible light from a 200 Watt Hg-Xe lamp positioned 4" from the substrate. The solution polymerized after exposure to visible radiation for 1 minute and heating at 50° C. for 30 minutes. Polymerization was initiated by the Bronsted acid released when the sulfonium salt was irradiated.

EXAMPLE 7

9,10-[Bis-2-phenylphenyl-p-cyanobenzylsulfonium-bis-hexafluorophosphate]anthracene (0.2 g) was dissolved in methylene chloride (2 ml) along with Bisphenol A diglycidyl ether monomer (1.0 g). A film of the prepolymer/sulfonium sensitizer composition was formed on a glass substrate by spin coating. The thin film (about.5 micrometers) was irradiated for 2 minutes with a 200 Watt Hg-Xe lamp as previously described. The polymer film became tough and cross-linked after heating at 50©C for 30 minutes. Cross-linking was initiated by the Bronsted acid released when the sulfonium salt was irradiated.

EXAMPLE 8

5,12-[Bis-2-phenylmethyl-2,4-dicyanobenzylsulfonium-bis-hexafluorophosphate]naphthacene was dissolved in methylene chloride (2 ml) along with Bisphenol A diglycidyl ether monomer (1.0 g). A film of the prepolymer/sulfonium sensitizer composition was formed on a glass substrate by spin coating. The thin film (about 0.5 micrometers) was irradiated for 2 minutes with a 200 Watt Hg-Xe lamp as previously described. The polymer film became tough and cross-linked after heating at 50oC for 30 minutes. Cross-linking was initiated by the Bronsted acid released when the sulfonium salt was irradiated.

EXAMPLE 9

1,4-Bis[3-phenylmethyl]-p-cyanobenzylsulfonium hexafluorophosphate-2-methoxynaphthalene was dissolved in methylene chloride (2 ml) along with Bisphenol A diglycidyl ether monomer (1.0 g). A film of the prepolymer/sulfonium sensitizer composition was formed on a glass substrate by spin coating. The thin film (about 0.5 micrometers) was irradiated for 2 minutes with a 200 Watt Hg-Xe lamp as previously described. The polymer film became tough and cross-linked after heating at 50° C. for 30 minutes. Cross-linking was initiated by the Bronsted acid released when the sulfonium salt was irradiated.

EXAMPLE 10

5,12-[Bis-2-phenylbutyl-3,5-bis-trifluoromethylbenzylsulfonium-bis-hexafluoroantimonate]-naphthacene was dissolved in methylene chloride (2 ml) along with Bisphenol A diglycidyl ether monomer (1.0 g). A film of the prepolymersulfonium sensitizer composition was formed on a glass substrate by spin coating. The thin film (about 0.5 micrometers) was irradiated for 2 minutes with a 200 Watt Hg-Xe lamp as previously described. The polymer film became tough and cross-linked after heating at 50° C. for 30 minutes. Cross-linking was initiated by the Bronsted acid released when the sulfonium salt was irradiated.

EXAMPLE 11

5,12-[Bis-2-phenylmethyl-2,4-dicyano-benzylsulfonium-bis-hexafluorophosphate]naphthacene (0.2 gm) was dissolved in methylene chloride (2 ml) along with Bisphenol A diglycidyl ether monomer (1.0 g). A film of the prepolymer-sulfonium sensitizer composition was formed on a glass substrate by spin coating. The thin film (0.5 micrometers) was irradiated for 2 minutes with a 200 Watt Hg-Xe lamp as previously described. The polymer film became tough and cross-linked after heating at 50° C. for 30 minutes. Cross-linking was initiated by the Bronsted acid released when the sulfonium salt was irradiated.

The following examples illustrate imagewise dye absorption changes as a result of dye protonation.

EXAMPLE 12

5,12-[Bis-2-phenylmethyl-2,4-dicyanobenzylsulfonium-bis-hexafluoroantimonate]naphthacene (0.2 gm) was dissolved in methylene chloride (5 ml) along with polystyrene, MW =100,000, (1.0 g) and propyl red indicator (0.001 g). A film of the above composition was formed on a 1" round glass disc (⅛" thick) by spin coating. The polymer film was then exposed to visible light from a Hg-Xe lamp positioned 4" from the substrate for 3 minutes. The initially yellow film turned red after the irradiation was complete as a result of the Bronsted acid released from the sulfonium salt and protonation of the propyl red indicator.

EXAMPLE 13

6,12-[Bis-2-phenylmethylbenzylsulfonium-bis-hexafluorophosphate]pentacene (0.3 gm) was dissolved in methylene chloride (5 ml) along with polystyrene, MW =100,000, (1.0 g) and propyl red indicator (0.001 g). A film of the above composition was formed on a 1" round disc (⅛' thick) by spin coating. The polymer film was then exposed to visible light from a Hg-Xe lamp positioned 4" from the substrate for 3 minutes. The initially yellow film turned red after the irradiation was complete as a result of the Bronsted acid released from the sulfonium salt and protonation of the propyl red indicator.

EXAMPLE 14

9,10-Bis[3-phenyl-n-butyl-p-cyanobenzylsulfonium hexafluoroantimonate]-2-t-butylanthracene (0.3 gm) was dissolved in methylene chloride (5 ml) along with polystyrene, MW =100,000, (1.0 g) and propyl red indicator (0.001 g). A film of the above composition was formed on a 1" round disc (⅛' thick) by spin coating. The polymer film was then exposed to visible light from a Hg-Xe lamp positioned 4" from the substrate for 3 minutes. The initially yellow film turned red after the irradiation was complete as a result of the Bronsted acid released from the sulfonium salt and protonation of the propyl red indicator.

The following examples illustrate imagewise conductive films for electrophotographic copying, circuit board fabrication, and fabrication of color filter arrays.

EXAMPLE 15

9,10-[Bis-2-phenylmethyl-p-cyanobenzylsulfonium-bis-trifluoromethanesulfonate]anthracene (0.2 gm) was dissolved in methylene chloride (5ml) along with polystyrene, MW =100,000, (1.0 g). A film of the above composition was cast onto a conductive substrate of either aluminum or nesa (InSnO) glass by spin coating. The solvent was allowed to evaporate in a vacuum oven with heating (25°-50° C. for 30 minutes). The polymer film was then exposed with a Hg-Xe lamp through a mask for 1 minute. The film was then charged with either a positive or negative corona while the conductive layer was held to ground. The ion-charge discharges more rapidly in the irradiated areas due to the presence of a Bronsted acid to produce a latent charged image which can be visualized by the conventional toning procedure. Transfer of the toned image to paper converts it to a permanent state. Additional copies of the charged image can be made by repeating the charging, toning, and transfer process without repeating the exposure step. Improved results, in terms of the amount of Bronsted acid generated, were obtained when the onium salt employed was 0.2 g of 9,10-[bis-3-phenylmethyl-p-cyanobenzylsulfonium-bis-trifluoromethanesulfonate]anthracene.

EXAMPLE 16

5,12-[Bis-2-phenylmethyl-2,4-dicyanobenzylsulfonium-bis-hexafluorophosphate]naphthacene (0.10 g) was dissolved in methylene chloride (5ml) along with poly(vinyl)benzoate, MW =100,000, (1.0 g). A film of the above composition was cast onto a conductive substrate of either aluminum or nesa (InSnO) glass by spin coating. The solvent was allowed to evaporate in a vacuum oven with heating (25°-50° C. for 30 minutes). The polymer film was then exposed to visible light from a Hg-Xe lamp through a mask for 1 minute. The film was then charged with either a positive or negative corona while the conductive layer was held to ground. The ion-charge discharges more rapidly in the irradiated areas due to the presence of a Bronsted acid to produce a latent image which can be visualized by the conventional toning procedure. Transfer of the toned image to paper converts it to a permanent state. Additional copies of the charged image can be made by repeating the charging, toning, and transfer process without repeating the exposure step.

EXAMPLE 17

9,10-Bis-[3-phenyl-n-butyl-p-cyanobenzylsulfonium trifluoromethanesulfonate]-2-t-butylanthacene (0.10 g) was dissolved in methylene chloride (5ml) along with poly(vinyl)benzoate, MW =100,000, (1.0 g). A film of the above composition was cast onto a conductive substrate of either aluminum or nesa (InSnO) glass by spin coating. The solvent was allowed to evaporate in a vacuum oven with heating (25°-50° C. for 30 minutes). The polymer film was then exposed to visible light from a Hg-Xe lamp through a mask for 1 minute. The film was then charged with either a positive or negative corona while the conductive layer was held to ground. The ion-charge discharges more rapidly in the irradiated areas due to the presence of a Bronsted acid to produce a latent image which can be visualized by the conventional toning procedure. Transfer of the toned image to paper converts it to a permanent state. Additional copies of the charged image can be made by repeating the charging, toning, and transfer process without repeating the exposure step.

The following examples illustrate the use of Bronsted photoacids for the production of printing plate masters.

EXAMPLE 18 - Printing Plate Masters 5,12-[Bis-2-phenylmethyl-2,4-dicyanobenzylsulfonium-bis-hexafluoroantimonate]naphthacene (10% by weight) was dissolved in sufficient acetonitrile solvent along with polyvinyl-(4-t-butylphenylcarbonate) as host polymer (90% by weight) to make a homogeneous solution. A film (.5 microns) of the polymer-photoacid composite was cast onto a flexible rectangular aluminum substrate 10"×12" in dimensions. After drying at 50 degrees for 10 minutes, the film was exposed in an imagewise fashion with an argon-ion laser. Development to produce a relief image in the exposed areas was achieved by heating the film to 100 degrees for 5 minutes. The aluminum substrate was then wrapped around a drum with the relief image exposed. The raised pattern could be selectively inked and the inked image transferred to a substrate such as paper. This process could be repeated many times.

EXAMPLE 19 - Printing Plate Masters 15 5,12[Bis-2-phenylmethyl-3,5-trifluoromethylbenzylsulfonium-bis-trifluoromethanesulfonate]-naphthacene was dissolved in sufficient acetonitrile solvent along with polyvinyl-(4-t-butylphenylcarbonate) as host polymer (90% by weight) to make a homogeneous solution. A film (.5 microns) of the polymer-photoacid composite was cast onto a flexible rectangular aluminum substrate 10"×12" in dimensions. After drying at 50 degrees for 10 minutes, the film was exposed in an imagewise fashion with an argon-ion laser. Development to produce a relief image in the exposed areas was achieved by heating the film to 100 degrees for 5 minutes. The aluminum substrate was then wrapped around a drum with the relief image exposed. The raised pattern could be selectively inked and the inked image transferred to a substrate such as paper. This process could be repeated many times.

EXAMPLE 20 - Printed Circuit Board Fabrication 5,12-Bis-2-phenylmethyl-3,5-bis-trifluoromethylbenzylsulfonium-bis-hexafluoroantimonate]-naphthacene (0.2 gm) and poly(4-t-butylphenylcarbonate) (1.9 gm) were dissolved in 5 ml of dichloromethane. A 1 mil film of the above composition was cast onto a copper substrate and allowed to dry for 15 minutes at 60° C. The film was exposed for two minutes in an imagewise fashion through a test target with a 5 watt argon-ion laser. The film was heat treated at 100° C. for 1 minute before development to remove the exposed regions with a 20% $Na_2CO_3$ solution. The exposed copper was etched with a nitric acid solution in the presence of molecular oxygen to produce a copper pattern for a printed circuit board.

The invention has been described in detail with particular reference to preferred embodiments thereof, but it will be understood that variations and modifications can be affected within the spirit and scope of the invention.

What is claimed is:

1. A composition of matter comprising a material curable by a Bronsted acid, and a bis-sulfonium, -selenonium, -arsonium, -ammonium, or -phosphonium salt comprising:

an aromatic or heterocyclic aromatic group which absorbs UV or visible radiation and which exhibits a higher energy occupied molecular orbital than at least one substituent attached to each of the S, Se, As, N or P atoms of said salt;

at least one substituent, attached to each of the S, Se, As, N or P atoms of said salt, which comprises an electron-withdrawing group which causes the lowest unoccupied molecular orbital to be localized on the substituent and the S, Se, As, N or P atom of the salt;

an insulating group which links said aromatic or heterocyclic aromatic group to each of the S, Se, As, N, or P atoms of said salt, said insulating group essentially preventing x resonance between said aromatic or heterocyclic aromatic group and the other substituents in said salt; and two anions;

said salt being capable, upon exposure to UV or visible radiation absorbed by said aromatic or heterocyclic aromatic group, of forming a Bronsted acid.

2. A composition of matter comprising a material curable by a Bronsted acid, and a compound which has one of the following formulas:

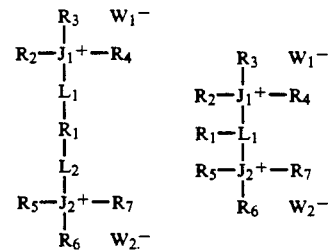

wherein:

$R_1$ represents an electron donating aromatic or heterocyclic aromatic group which absorbs UV or visible radiation and which exhibits a higher energy occupied molecular orbital greater than $R_3$ and $R_6$;

$R_2$ and $R_5$ each, independently, represent the same substituent as $R_3$ or $R_6$ or an alkyl group having from 1 to 18 carbon atoms;

$L_1$ and $L_2$ each, independently, represent a linking group which essentially prevents $\pi$ resonance between $R_1$ and the remainder of the compound;

R3 and R6 each, independently, represent an electron withdrawing alkyl, aryl or heterocyclic group, which electron withdrawing group causes the lowest unoccupied molecular orbital to be localized on R3, R6 and the S, Se, As, N or P atoms of the salt;

J1 and J2 each, independently, represent an S, Se, As, N or P atom, and, when J1 or J2 represents As, N or P, R4 and R7, respectively, represent the same substituent as R3, R4, R5 or R6 and, when J1 or J2 represents an S or Se atom, R4 and R7 each, independently, represent O or an electron pair; and, $W_1^-$ and $W_2^-$ each, independently, represents an anion capable of forming a Bronsted acid having a pKa of less than 7, said compound being capable, upon exposure to UV or visible radiation absorbed by $R_1$, of forming a Bronsted acid.

3. A composition of matter as defined in claim 2 in which, in the definition of the substituents in the formulas, $L_1$ and $L_2$ each represents a phenyl or a naphthyl linkage and $J_1$ and $J_2$ are attached to the phenyl or naphthyl linkage in the 3-position with respect to $R_1$.

4. A composition of matter comprising a material curable by a Bronsted acid, and a bis-sulfonium, -selenonium, -arsonium, -ammonium, or -phosphonium salt comprising:

an aromatic or heterocyclic aromatic group which absorbs UV or visible radiation and which exhibits a higher energy occupied molecular orbital than at least one substituent attached to each of the S, Se, As, N or P atoms of said salt;

at least one substituent, attached to each of the S, Se, As, N or P atoms of said salt, which comprises an electron-withdrawing group which causes the lowest unoccupied molecular orbital to be localized on the substituent and the S, Se, As, N or P atom of the salt;

an insulating group which links said aromatic or heterocyclic aromatic group to each of the S, Se, As, N, or P atoms of said salt, said insulating group essentially preventing $\pi$ resonance between said aromatic or heterocyclic aromatic group and the other substituents in said salt; and two anions;

said salt being capable, upon exposure to UV or visible radiation absorbed by said aromatic or heterocyclic aromatic group, of forming a Bronsted acid.

5. A polyester support having thereon a coating comprising a material curable by a Bronsted acid and a compound having one of the following formulas:

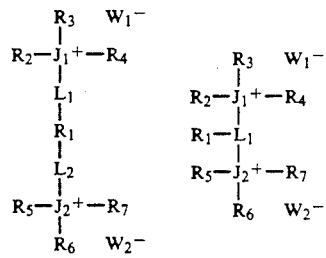

wherein:

$R_1$ represents an electron donating aromatic or heterocyclic aromatic group which absorbs UV or visible radiation and which exhibits a higher energy occupied molecular orbital greater than $R_3$ and $R_6$;

$R_2$ and $R_5$ each, independently, represent the same substituent as $R_3$ or $R_6$ or an alkyl group having from 1 to 18 carbon atoms;

$L_1$ and $L_2$ each, independently, represent a linking group which essentially prevents $\pi$ resonance between $R_1$ and the remainder of the compound;

$R_3$ and $R_6$ each, independently, represent an electron withdrawing alkyl, aryl or heterocyclic group, which electron withdrawing group causes the lowest unoccupied molecular orbital to be localized on $R_3$, $R_6$ and the S, Se, As, N or P atom of the salt;

$J_1$ and $J_2$ each, independently, represent an S, Se, As, N or P atom, and, when $J_1$ or $J_2$ represents As, N or P, $R_4$ and $R_7$, respectively, represent the same substituent as $R_3$, $R_4$, $R_5$ or $R_6$ and, when $J_1$ or $J_2$ represents an S or Se atom, $R_4$ and $R_7$ each, independently, represent O or an electron pair; and, $W_1^-$ and $W_2^-$ each, independently, represents an anion capable of forming a Bronsted acid having a pKa of less than 7, said compound being capable, upon exposure to UV or visible radiation absorbed by $R_1$, of forming a Bronsted acid.

* * * * *